United States Patent
Kim

(10) Patent No.: US 7,266,662 B2
(45) Date of Patent: Sep. 4, 2007

(54) INPUT/OUTPUT DATA PIPELINE CIRCUIT OF SEMICONDUCTOR MEMORY DEVICE AND THE SEMICONDUCTOR MEMORY DEVICE

(75) Inventor: Youn-Cheul Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 306 days.

(21) Appl. No.: 10/786,471

(22) Filed: Feb. 26, 2004

(65) Prior Publication Data

US 2004/0221119 A1 Nov. 4, 2004

(30) Foreign Application Priority Data

Feb. 26, 2003 (KR) ............... 10-2003-0011855

(51) Int. Cl.
*G06F 12/00* (2006.01)
(52) U.S. Cl. ............... 711/169; 711/167; 711/168; 365/189.05
(58) Field of Classification Search ............... None
See application file for complete search history.

(56) References Cited

U.S. PATENT DOCUMENTS

| 6,263,448 | B1 * | 7/2001 | Tsern et al. | 713/501 |
| 6,359,831 | B1 * | 3/2002 | McLaury | 365/233 |
| 6,363,465 | B1 * | 3/2002 | Toda | 711/169 |
| 6,606,300 | B1 * | 8/2003 | Blanc et al. | 370/229 |

* cited by examiner

*Primary Examiner*—Reginald Bragdon
*Assistant Examiner*—Horace L. Flournoy
(74) *Attorney, Agent, or Firm*—Volentine & Whitt, P.L.L.C.

(57) ABSTRACT

An input/output data pipeline circuit of a semiconductor memory device includes a first transmitting unit, a control signal generating unit, and a second transmitting unit. The first transmitting unit receives data stored in a memory cell and transmits data to an input/output driver in response to activation of a first switching signal and a second switching signal. The control signal generating unit receives a clock signal from the semiconductor memory device and, corresponding to the frequency of the clock signal, outputs a control signal, the first switching signal, and the second switching signal. The second transmitting unit transmits data to the input/output driver in response to activation of the control signal. The first transmitting unit and the second transmitting unit are alternatively activated.

16 Claims, 4 Drawing Sheets

INPUT/OUTPUT DATA PIPELINE CIRCUIT OF SEMICONDUCTOR MEMORY DEVICE AND THE SEMICONDUCTOR MEMORY DEVICE

CROSS REFERENCES TO RELATED APPLICATIONS

This application claims priority under U.S.C. §119 from Korean Patent Application No. 2003-11855, filed on 25 Feb. 2003, the contents of which are hereby incorporated by reference in their entirety for all purposes as if fully set forth herein.

BACKGROUND AND SUMMARY

1. Technical Field

The present invention relates to a semiconductor memory device, and more particularly, to an input/output data pipeline circuit of a semiconductor memory device and the semiconductor memory device.

2. Description

During the read operation of a semiconductor memory device, data stored in a memory cell is output to a data output driver by predetermined read address signals. A semiconductor memory device is capable of performing a burst operation, in which a plurality of data is continuously output. Such a semiconductor memory device includes a pipeline circuit, located between the data output driver and a memory cell array.

FIG. 1 is a circuit diagram of an input/output data pipeline circuit of a conventional semiconductor memory device. An input/output data pipeline circuit 1000 of FIG. 1 includes a first pipeline circuit 100 and a data output circuit 110. The first pipeline circuit 100 includes a first switching circuit 11, a latching circuit 12, and a second switching circuit 13.

In response to activation of the first switching signal WRTPIPE, the first switching circuit 11 is switched on and outputs data RWD read from a memory cell. The latching circuit 12 receives and latches the output of the first switching circuit 11, and outputs an inverted signal of the output of the first switching circuit 11. In response to activation of the second switching signal LOAD, the second switching circuit 13 is switched on and outputs the signal from the latching circuit 12. Based on the logic state and time delay of the data RWD, an inverter 14 may be connected to the output terminal of the second switching circuit 13.

The data output circuit 110 includes an inverter 15 and a third switching circuit 16. The data output circuit 110 is connected to the output of an nth pipeline circuit (not shown) and outputs the output signal OUTN of the nth pipeline circuit (not shown) in response to activation of the selection signal SEL. Output signal OUTN of the nth pipeline circuit (not shown) is identical to output signal OUT of the first pipeline circuit 100, and is output after the nth pipeline circuit (not shown) receives data from another memory cell.

Data output to a data output driver (not shown) is selected based on logic states of the selection signal SEL, the first switching signal WRTPIPE, and the second switching signal LOAD. For example, when selection signal SEL is inactive, and first switching signal WRTPIPE and second switching signal LOAD are active, output signal OUT of the first pipeline circuit 100 is output to the data output driver (not shown).

When selection signal SEL, first switching signal WRTPIPE, and second switching signal LOAD are active, output signal OUTN of the nth pipeline circuit (not shown) is output to the data output driver (not shown).

Data RWD, read from the memory cell, is processed and output by the first pipeline circuit 100. Namely, data RWD is output through the first switching circuit 11 that is switched on in response to activation of the first switching signal WRTPIPE and inverted signal WRTPIPEB thereof, latched by the latching circuit 12, and then output through the second switching circuit 13 that is switched on in response to activation of the second switching signal LOAD and inverted signal LOADB thereof.

To output data RWD without distortion, the second switching signal LOAD is activated after the first switching signal WRTPIPE is activated. In other words, when first switching signal WRTPIPE is activated to logic high, data RWD is transmitted to the latching circuit 12, and the latching circuit 12 latches and outputs data RWD. Once the second switching signal LOAD is activated, data RWD passes through the second switching unit 13 without distortion.

However, if the frequency of the clock signal becomes higher or data RWD is input to the first pipeline circuit 100 too late, the second switching signal LOAD may activate prior to activation of the first switching signal WRTPIPE. If this occurs, the window of data RWD may be small and erroneous data may be fed to the first pipeline circuit 100.

Accordingly, there exists the need for a pipeline circuit that can determine whether the second switching signal LOAD is activated prior to activation of the first switching signal WRTPIPE and output data without distortion based on the determined result.

The present invention provides an input/output data pipeline circuit which generates a control signal based on a clock signal of a semiconductor memory device and is controlled by the logic state of the control signal.

The present invention also provides a semiconductor memory device with the input/output data pipeline circuit.

According to an aspect of the present invention, there is provided an input/output data pipeline circuit of a semiconductor memory device. The input/output data pipeline circuit comprises a first transmitting unit, a control signal generating unit, and a second transmitting unit. The first transmitting unit receives data stored in a memory cell and transmits data to an input/output driver in response to activation of a first switching signal and a second switching signal. The control signal generating unit receives a clock signal from the semiconductor memory device and, corresponding to the frequency of the clock signal, outputs a control signal, the first switching signal, and the second switching signal. The second transmitting unit transmits data to the input/output driver in response to activation of the control signal. The first transmitting unit and the second transmitting unit are alternatively activated.

Preferably, the first transmitting unit comprises a first switching circuit, which outputs data in response to activation of the first switching signal, a latching circuit, which latches and outputs the output of the first switching circuit, and a second switching circuit, which outputs the output of the latching circuit to the input/output driver in response to activation of the second switching signal.

Preferably, the second transmitting unit comprises a third switching circuit, which outputs data to the input/output driver in response to activation of the control signal.

According to another aspect of the present invention, there is provided a semiconductor memory device. The semiconductor memory device comprises a memory cell core, an input/output driver, an input/output data pipeline circuit, and a control signal generating unit. The memory cell core includes a plurality of memory cells. The input/output driver receives first data from outside of the semiconductor memory device, in synchronization with a first clock signal, or outputs second data stored in the memory cell core, in synchronization with a second clock signal. The input/output data pipeline circuit is connected to the memory cell core and the input/output driver, and transmits the second data stored in the memory cell core to the input/output driver or transmits the first data received from outside of the semiconductor memory device to the memory cell core. The control signal generating unit receives the first clock signal and the second clock signal, and outputs a control signal corresponding to frequencies of the first clock signal and the second clock signal. The input/output data pipeline circuit includes a first transmitting unit, which performs a transmission operation between the memory cell core and the input/output driver in response to activation of a first switching signal, and a second switching signal and a second transmitting unit which performs a transmission operation between the memory cell core and the input/output driver in response to activation of the control signal, and the first transmitting unit and the second transmitting unit are alternatively activated.

Preferably, the control signal generating unit detects a phase difference between the first clock signal and the second clock signal, and outputs the control signal with a logic state based on a detected result.

According to yet another aspect of the present invention, there is provided a semiconductor memory device. The semiconductor memory device comprises a memory cell core, an input/output driver, a control signal generating unit, and an input/output data pipeline circuit. The memory cell core includes a plurality of memory cells. The control signal generating unit receives a first clock signal, a second clock signal, and information about operation modes of the semiconductor memory device, and outputs a first switching signal, a second switching signal, and a control signal corresponding to the first clock signal, the second clock signal, and information about the operation modes of the semiconductor memory device. The input/output data pipeline circuit is connected to the memory cell core and the input/output driver, and transmits data stored in the memory cell core to the input/output driver in response to activation of the first switching signal, the second switching signal, and the control signal. The input/output data pipeline circuit includes a first transmitting unit, which is activated in response to activation of the first switching signal and the second switching signal, and a second transmitting unit, which is activated in response to activation of the control signal, and the first transmitting unit and the second transmitting unit are alternatively activated.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION

The present invention will now be described more fully with reference to the accompanying drawings, in which preferred embodiments of the invention are shown.

Figure 1:
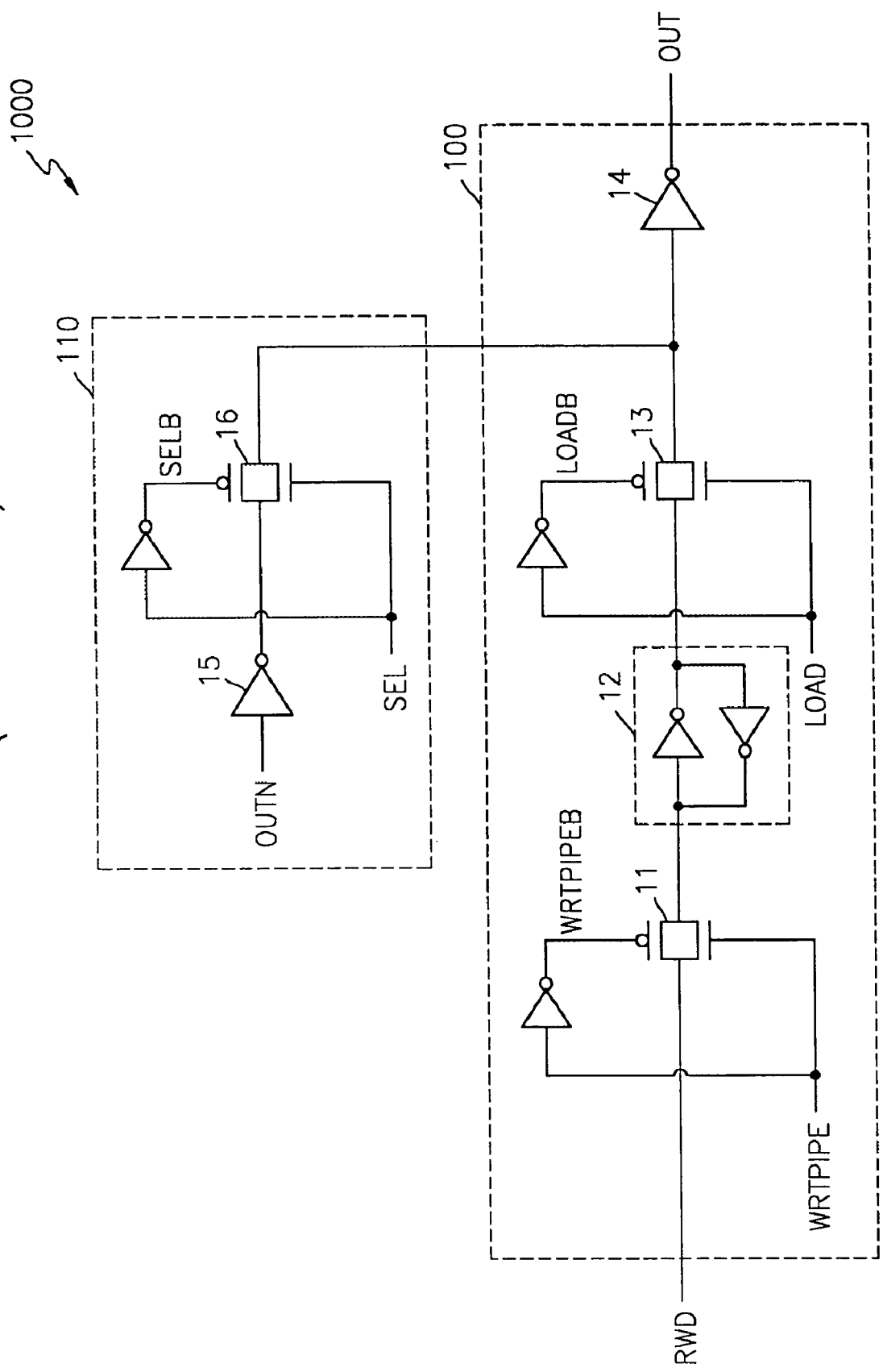
FIG. 1 is a circuit diagram of a conventional input/output data pipeline circuit of a semiconductor memory device.
Figure 2:
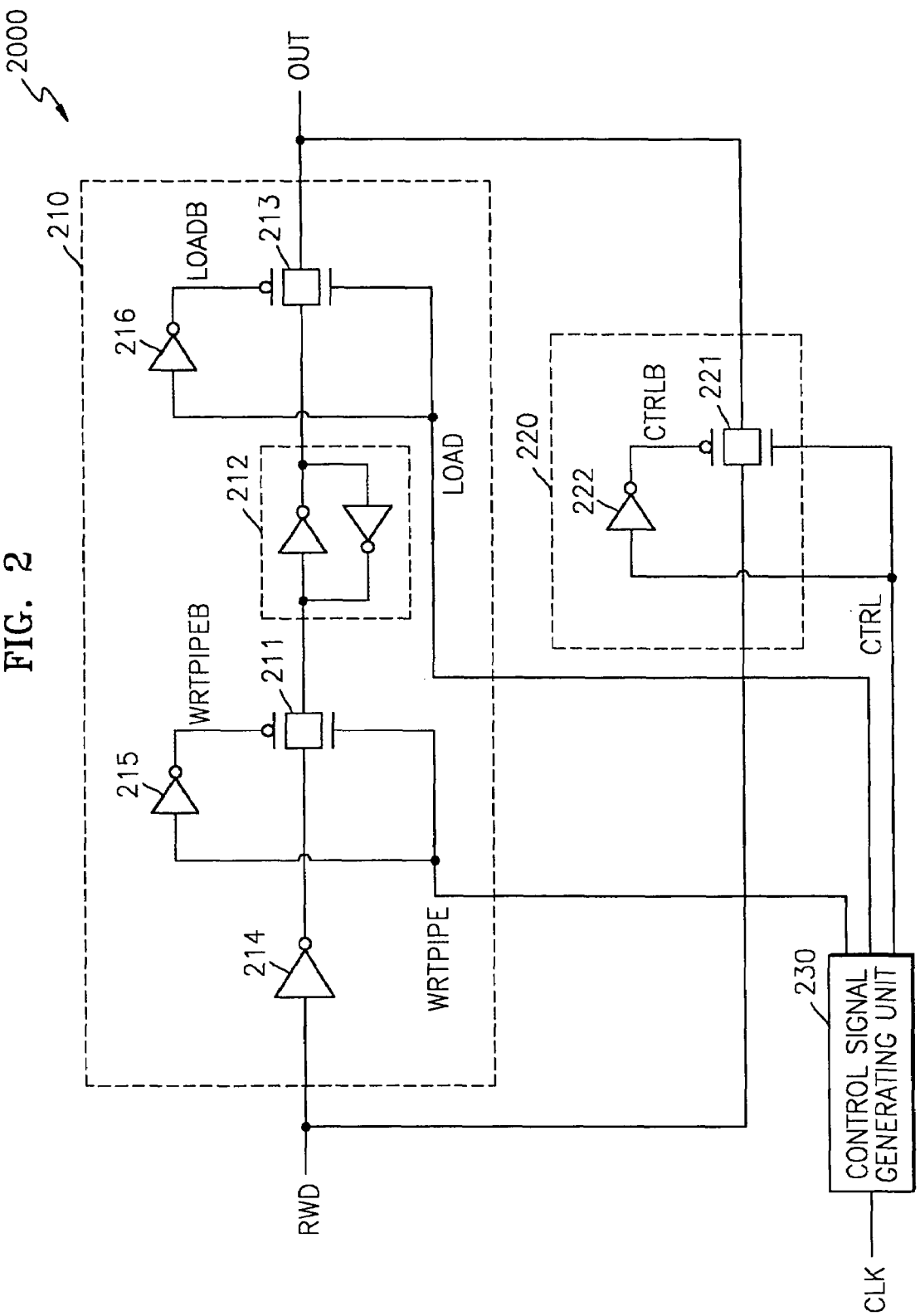
FIG. 2 is a circuit diagram of an input/output data pipeline circuit of a semiconductor memory device, according to an embodiment of the present invention.

FIG. 2 is a circuit diagram of an input/output data pipeline circuit of a semiconductor memory device, according to an embodiment of the present invention. Referring to FIG. 2, an input/output data pipeline circuit 2000 includes a first transmitting unit 210, a second transmitting unit 220, and a control signal generating unit 230.

The first transmitting unit 210 includes a first switching circuit 211, a latching circuit 212, a second switching circuit 213, and a plurality of inverters 214, 215, and 216. The first switching circuit 211 is switched on in response to activation of the first switching signal WRTPIPE. The second switching circuit 213 is switched on in response to activation of the second switching signal LOAD. In this embodiment, the first transmitting unit 210 and the second transmitting unit 220 are implemented using transmission gates.

The inverter 214 receives data RWD from a memory cell (not shown), inverts data RWD, and outputs the inverted data to the first switching circuit 211. The first transmitting unit 210 includes the inverter 214 for matching the logic state of data RWD with the logic state of output signal OUT.

The inverter 215 inverts the first switching signal WRTPIPE and outputs the inverted first switching signal WRTPIPEB. The inverter 216 inverts the second switching signal LOAD and outputs the inverted second switching signal LOADB. The inverted first switching signal WRTPIPEB and inverted second switching signal LOADB constitute a pair, that signals are used for the switching operation of the first switching circuit 211 or the second switching circuit 213.

The second transmitting unit 220 includes a third switching circuit 221. The third switching circuit 221 is switched on in response to activation of the control signal CTRL.

The control signal generating unit 230 receives the clock signal CLK and generates the control signal CTRL, the first switching signal WRTPIPE, and the second switching signal LOAD based on the frequency of the clock signal CLK. In other words, the control signal generating unit 230 controls logic states of control signal CTRL, first switching signal WRTPIPE, and second switching signal LOAD based on the frequency of clock signal CLK.

Hereinafter, the operation of the input/output data pipeline circuit 2000 will be described with reference to FIG. 2.

The input/output data pipeline circuit 2000 receives data RWD from a memory cell (not shown) and outputs data OUT to a data output driver (not shown). During this operation, the control signal generating unit 230 outputs the first switching signal WRTPIPE, the second switching signal LOAD, and the control signal CTRL based on the frequency of the clock signal CLK.

During normal operation, in which the frequency of the clock signal CLK is low, the first transmitting unit 210 receives data RWD from a memory cell and outputs data OUT. At this time, the first transmitting unit 210 is active while the second transmitting unit 220 is inactive. The first transmitting unit 210 is activated in response to activation of the first switching signal WRTPIPE and second switching signal LOAD. The second transmitting unit 220 is deactivated in response to deactivation of the control signal CTRL.

In other words, during normal operation, the first switching signal WRTPIPE and the second switching signal LOAD are activated, i.e., enter a logic high state, and control signal CTRL is deactivated, i.e., enters a logic low state.

When the control signal generating circuit 230 outputs the first switching signal WRTPIPE as a logic high signal, the inverted first switching signal WRTPIPEB is set to a logic low state. Thus, data RWD passes the latching circuit 212 through the first switching circuit 211.

When the control signal generating circuit 230 outputs the second switching signal LOAD as a logic high signal, the inverted second switching signal LOADB is set to a logic low state. Thus, data OUT passes through the second switching circuit 213 from the latching circuit 212.

At this time, the control signal generating circuit 230 outputs the control signal CTRL as a logic low signal. Preferably, the first switching signal WRTPIPE is activated prior to activation of the second switching signal LOAD. In other words, after the first switching signal WRTPIPE is activated and data RWD is transmitted to the latching circuit 212, the second switching signal LOAD can be activated, thus enabling data RWD to be output as data OUT from the latching circuit 212.

When the frequency of the clock signal CLK is high, the second transmitting unit 220 receives data RWD and outputs data OUT. At this time, the first transmitting unit 210 is inactive and the second transmitting unit 220 is active. In other words, the second transmitting unit 220 outputs data RWD to outside of the input/output data pipeline circuit 2000.

At this time, the control signal generating circuit 230 outputs the control signal CTRL as a logic high signal, the inverter 222 inverts the control signal CTRL and outputs the inverted control signal CTRLB. The inverted control signal CTRLB is set to a logic low state, and data RWD passes through the third switching circuit 221.

When the control signal CTRL is active, the second switching signal LOAD is, preferably, inactive. At this time, the first switching signal WRTPIPE is, more preferably, inactive. If first switching signal WRTPIPE and second switching signal LOAD were active, data RWD, transmitted by the second transmitting unit 220, might collide with data RWD transmitted by the first transmitting unit 210, which would cause the input/output data pipeline circuit 2000 to malfunction.

In other words, in the input/output data pipeline circuit 2000, when the frequency of the clock signal CLK is low, the first transmitting unit 210 transmits data RWD based on the frequency of clock signal CLK. When the frequency of clock signal CLK is high, the second transmitting unit 220 transmits data RWD based on the frequency of clock signal CLK. Therefore, the input/output data pipeline circuit 2000 operates normally, irrespective of activation timing for the first switching signal WRTPIPE and the second switching signal LOAD.

Figure 3:
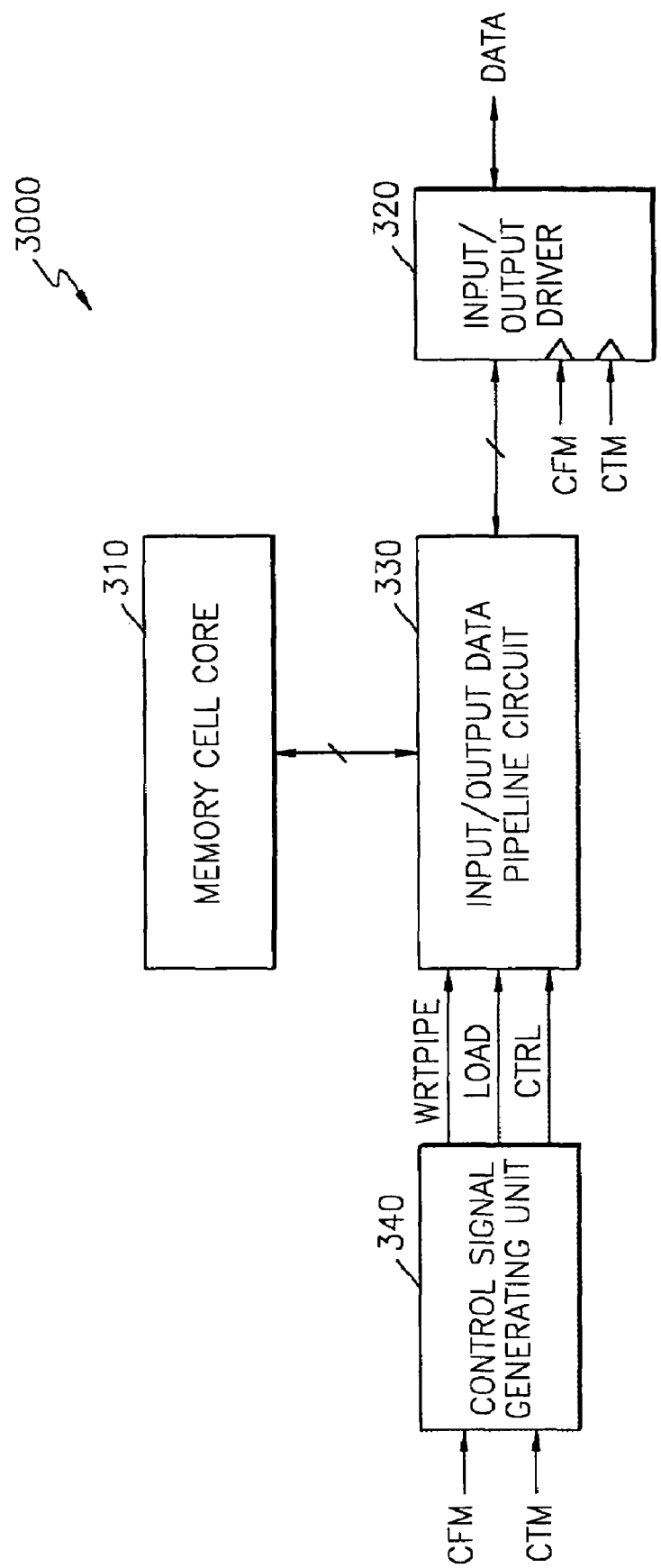
FIG. 3 illustrates a semiconductor memory device with an input/output data pipeline circuit, according to a first embodiment of the present invention.

FIG. 3 illustrates a semiconductor memory device with an input/output data pipeline circuit, according to a first embodiment. Referring to FIG. 3, a semiconductor memory device 3000 includes a memory cell core 310, an input/output driver 320, an input/output data pipeline circuit 330, and a control signal generating unit 340.

The memory cell core 310 includes a plurality of memory cells (not shown). The input/output driver 320 receives data DATA from outside the semiconductor memory device in synchronization with first clock signal CFM, or outputs DATA in synchronization with the second clock signal CTM.

The input/output data pipeline circuit 330 is connected between the memory cell core 310 and the input/output driver 320, and transmits data DATA from the memory cell core 310 to the input/output driver 320 or vice versa.

The input/output data pipeline circuit 330 is configured with the first transmitting unit 210 and the second transmitting unit 220 in the input/output data pipeline circuit 2000 of FIG. 2. The first transmitting unit 210 is activated in response to activation of the first switching signal WRTPIPE and the second switching signal LOAD. The second transmitting unit 220 is activated in response to activation of the control signal CTRL. The first transmitting unit 210 and the second transmitting unit 220 are alternatively activated.

The control signal generating unit 340 receives the first clock signal CFM and the second clock signal CTM and generates first switching signal WRTPIPE, the second switching signal LOAD, and the control signal CTRL in response to first clock signal CFM and second clock signal CTM. Control over the input/output data pipeline circuit 330 is influenced by the logic states of the first switching signal WRTPIPE, the second switching signal LOAD, and the control signal CTRL.

The first clock signal CFM is used during the write operation of the semiconductor memory device 3000, i.e., when data DATA is input to the input/output driver 320. The second clock signal CTM is used during the read operation of the semiconductor memory device 3000, i.e., when data DATA is output from the memory cell core 310. The first clock signal CFM and the second clock signal CTM have the same frequency but different phases.

In the case of a conventional input/output data pipeline circuit, data is transmitted from a memory cell core to an input/output driver or vice versa, respectively, in response to activation of the first switching signal WRTPIPE and the second switching signal LOAD. However, the input/output data pipeline circuit may operate abnormally in relation to the activation timing for the first switching signal WRTPIPE and the second switching signal LOAD.

In contrast, the semiconductor memory device 3000 can prevent malfunction of the input/output data pipeline circuit 330 using the control signal CTRL.

Hereinafter, the operation of the semiconductor memory device 3000 will be described with reference to FIGS. 2 and 3.

Data DATA is transmitted, via the input/output data pipeline circuit 330, from the memory cell core 310 to the input/output driver 320 or vice versa. During this operation, the input/output data pipeline circuit 330 is controlled by the first switching signal WRTPIPE and the second switching signal LOAD. At this time, the first switching signal WRTPIPE must be sufficiently activated prior to activation of the second switching signal LOAD. Otherwise, the input/output data pipeline circuit 330 operates abnormally and outputs data with distortion.

Activation timing for the first switching signal WRTPIPE and the second switching signal LOAD vary with the phase difference between the first clock signal CFM and the second clock signal CTM. If the phase difference between the first clock signal CFM and the second clock signal CTM is small, the first switching signal WRTPIPE is activated prior to activation of the second switching signal LOAD, and the input/output data pipeline circuit 330 operates normally.

Yet, if the phase difference between the first clock signal CFM, and the second clock signal CTM is large, the activation timing for the second switching signal LOAD approaches the activation timing for the first switching signal WRTPIPE. The worst case is that the second switching signal LOAD may be activated prior to activation of the first switching signal WRTPIPE.

Thus, the control signal generating unit 340 detects the phase difference between first clock signal CFM and second clock signal CTM and controls the logic states of the first switching signal WRTPIPE, the second switching signal LOAD, and the control signal CTRL, based on the detected result. As shown in FIG. 2, the input/output data pipeline circuit 330 includes the first transmitting unit 210 and the second transmitting unit 220. The first transmitting unit 210 is activated in response to activation of the first switching signal WRTPIPE and the second switching signal LOAD. The second switching unit 220 is activated in response to activation of the control signal CTRL.

If the phase difference between the first clock signal CFM and the second clock signal CTM is small, the first switching signal WRTPIPE and the second switching signal LOAD are activated, e.g., enter a first logic high state, and the control signal CTRL is deactivated, e.g., enters a second logic low state.

In this case, data RWD is output as data OUT by the first transmitting unit 210. The input/output driver 320 receives data OUT from the first transmitting unit 210 and outputs data DATA in synchronization with the second clock signal CTM. The first switching signal WRTPIPE is preferably activated prior to activation of the second switching signal LOAD.

However, if the phase difference between first clock signal CFM and second clock signal CTM is large, first switching signal WRTPIPE and the second switching signal LOAD are deactivated, e.g., enter a second logic low state, and control signal CTRL is activated, e.g., enters a first logic high state.

In this case, data RWD is output as data OUT by the second transmitting unit 220. The input/output driver 320 receives data OUT from the second transmitting unit 220 and outputs data DATA in synchronization with the second clock signal CTM.

In other words, the first transmitting unit 210 and the second transmitting unit 220 are alternatively activated based on the phase difference between the first clock CFM and the second clock signal CTM. This enables normal operation of the input/output data pipeline circuit 330.

Figure 4:
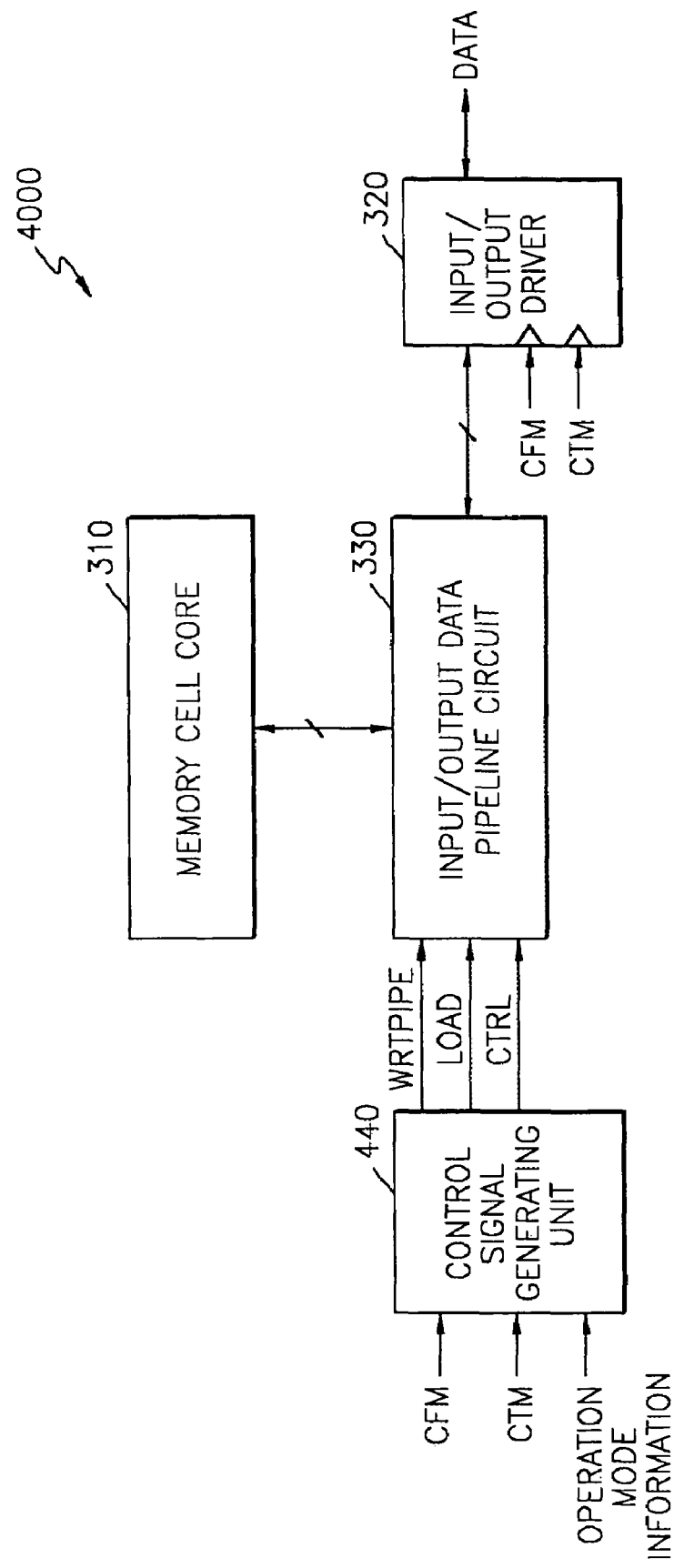
FIG. 4 illustrates a semiconductor memory device with an input/output data pipeline circuit, according to a second embodiment of the present invention.

FIG. 4 illustrates a semiconductor memory device with an input/output data pipeline circuit, according to a second embodiment. Referring to FIG. 4, a semiconductor memory device 4000 includes a memory cell core 310, an input/output driver 320, an input/output data pipeline circuit 330, and a control signal generating unit 440.

Since the memory cell core 310, the input/output driver 320, and the input/output data pipeline circuit 330 have configurations similar to those of the semiconductor memory device 3000, they will not described here.

The control signal generating unit 440 receives the first clock signal CFM, the second clock signal CTM, and operation mode information, and outputs the first switching signal WRTPIPE, the second switching signal LOAD, and the control signal CTRL. Compared with the control signal generating unit 340 of FIG. 3, the control signal generating unit 440 further receives the operation mode information.

Operation mode information denotes information regarding the operation mode of the semiconductor memory device 4000. The semiconductor memory device 4000 has various operation modes. Each operation mode is distinguished by a difference in characteristics, which includes clock signal frequency and latency.

When the semiconductor memory device 4000 operates at a low frequency, the first switching signal WRTPIPE and the second switching signal LOAD are sequentially activated.

If the control signal generating unit 440 receives operation mode information indicating that the semiconductor memory device 4000 is operating at a low frequency, the control signal generating unit 440 activates the first switching signal WRTPIPE and the second switching signal LOAD, and deactivates control signal CTRL, irrespective of the phase difference between the first clock signal CFM and the second clock signal CTM. In other words, if the control signal generating unit 440 receives operation mode information indicating that the semiconductor memory device 4000 is operating at a low frequency, the first transmitting unit 210 is activated and the second transmitting unit 220 is deactivated.

The semiconductor memory device 4000 operates at a low frequency during a drowsy mode, a DA mode, and etc. During the drowsy mode, the semiconductor memory device 4000 is not operating at a high frequency, since a delayed locked loop (DLL) in the semiconductor memory device 4000 is not activated. During the DA mode, the semiconductor memory device 4000 undergoes testing.

On the other hand, when the control signal generating unit 440 receives operation mode information indicating that the semiconductor memory device 4000 is operating in a high-frequency mode, then the control signal generating unit 440 deactivates the first switching signal WRTPIPE and the second switching signal LOAD, and activates control signal CTRL, irrespective of the phase difference between the first clock signal CFM and the second clock signal CTM.

As described above, the input/output data pipeline circuit is controlled by switching signals and a control signal that are generated based on the frequency of a clock signal and operation mode information of the semiconductor memory device. This functionality enables the input/output data pipeline circuit and the semiconductor memory device to operation properly While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. An input/output data pipeline circuit of a semiconductor memory device, comprising:
    a control signal generating unit adapted to receive a clock signal and adapted to output a control signal, a first switching signal, and a second switching signal, according to a frequency of the clock signal;
    a first transmitting unit adapted to receive data stored in a memory cell and to transmit data to an input/output driver in response to activation of the first switching signal and the second switching signal; and
    a second transmitting unit adapted to transmit data to the input/output driver in response to activation of the control signal,
    wherein the first transmitting unit and the second transmitting unit are adapted to be alternatively activated.

2. The input/output data pipeline circuit of claim 1, wherein the first transmitting unit comprises:
    a first switching circuit adapted to output data in response to activation of the first switching signal;
    a latching circuit adapted to latch and output the output of the first switching circuit; and a second switching circuit adapted to output the output of the latching circuit to the input/output driver in response to activation of the second switching signal.

3. The input/output data pipeline circuit of claim 1, wherein the second transmitting unit comprises a third switching circuit, which is adapted to output data to the input/output driver in response to activation of the control signal.

4. The input/output data pipeline circuit of claim 1, wherein the first transmitting unit is adapted to be activated when the first switching signal and the second switching signal are activated, and the control signal is deactivated.

5. The input/output data pipeline circuit of claim 4, wherein the first switching signal is activated prior to activation of the second switching signal.

6. The input/output data pipeline circuit of claim 1, wherein the second transmitting unit is adapted to be activated when the control signal is activated, and the first and second switching signals are deactivated.

7. A semiconductor memory device comprising:
a memory cell core, which includes a plurality of memory cells;
an input/output driver adapted to receive first data from outside of the semiconductor memory device, in synchronization with a first clock signal, and adapted to output second data stored in the memory cell core, in synchronization with a second clock signal;
an input/output data pipeline circuit, which is connected to the memory cell core and the input/output driver, which is adapted to transmit the second data stored in the memory cell core to the input/output driver, and which is adapted to transmit the first data received from outside of the semiconductor memory device to the memory cell core; and
a control signal generating unit, which is adapted to receive the first clock signal and the second clock signal, and which is adapted to output a control signal corresponding to frequencies of the first clock signal and the second clock signal,
wherein the input/output data pipeline circuit includes a first transmitting unit, which is adapted to perform a transmission operation between the memory cell core and the input/output driver in response to activation of a first switching signal and a second switching signal, and a second transmitting unit which is adapted to perform a transmission operation between the memory cell core and the input/output driver in response to activation of the control signal, and
wherein the first transmitting unit and the second transmitting unit are adapted to be alternatively activated.

8. The semiconductor memory device of claim 7, wherein the control signal generating unit which is adapted to detect a phase difference between the first clock signal and the second clock signal, and which is adapted to output the control signal with a logic state based on a detected result.

9. The semiconductor memory device of claim 7, wherein the first transmitting unit comprises:
a first switching circuit, which is which is adapted to be switched on and output the first data or the second data in response to activation of the first switching signal;
a latching circuit, which is adapted to latch and output the output of the first switching circuit; and
a second switching circuit, which is which is adapted to be switched on and output the output of the latching circuit to the input/output driver in response to activation of the second switching signal.

10. The semiconductor memory device of claim 9, wherein the first transmitting unit is adapted to be activated when the first switching signal and the second switching signal are activated, and the control signal is deactivated.

11. The semiconductor memory device of claim 10, wherein the first switching signal is activated prior to activation of the second switching signal.

12. The semiconductor memory device of claim 9, wherein the second transmitting unit is adapted to be activated when the control signal is activated, and the first and second switching signals are deactivated.

13. The semiconductor memory device of claim 7, wherein the control signal generating unit is further adapted to receive information about operation modes of the semiconductor memory device, and the control signal corresponds to the first clock signal, the second clock signal, and information about operation modes of the semiconductor memory device.

14. The semiconductor memory device of claim 13, wherein when information about the operation modes of the semiconductor memory device indicates that the semiconductor memory device operates at a low frequency, the first switching signal and the second switching signal are activated, i.e., enter a predetermined logic state, the control signal is deactivated, and the first switching signal is activated prior to activation of the second switching signal.

15. A semiconductor memory device comprising:
a memory cell core, which includes a plurality of memory cells;
an input/output driver;
a control signal generating unit adapted to receive a first clock signal, a second clock signal, and information about operation modes of the semiconductor memory device, and which is adapted to output a first switching signal, a second switching signal, and a control signal corresponding to the first clock signal, the second clock signal, and information about the operation modes of the semiconductor memory device; and
an input/output data pipeline circuit, which is connected to the memory cell core and the input/output driver, and which is adapted to transmit data stored in the memory cell core to the input/output driver in response to activation of the first switching signal, the second switching signal, and the control signal,
wherein the input/output data pipeline circuit includes a first transmitting unit, which is adapted to be activated in response to activation of the first switching signal and the second switching signal, and a second transmitting unit which is adapted to be activated in response to activation of the control signal, and
wherein the first transmitting unit and the second transmitting unit are adapted to be alternatively activated.

16. The semiconductor memory device of claim 15, wherein the control signal generating unit is adapted to detect a phase difference between the first clock signal and the second clock signal, and is adapted to output the control signal with a logic state corresponding to a detected result, and if the control signal generating unit receives information about the operation modes of the semiconductor memory device indicating that the semiconductor memory device operates at a low frequency, the first transmitting unit is activated irrespective of the phase difference between the first clock signal and the second clock signal.

* * * * *